(12) United States Patent
Leung et al.

(10) Patent No.: US 6,486,480 B1
(45) Date of Patent: Nov. 26, 2002

(54) PLASMA FORMED ION BEAM PROJECTION LITHOGRAPHY SYSTEM

(75) Inventors: Ka-Ngo Leung, Hercules, CA (US); Yung-Hee Yvette Lee, Berkeley, CA (US); Vinh Ngo, San Jose, CA (US); Nastaran Zahir, Greenbrae, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/289,333

(22) Filed: Apr. 9, 1999

Related U.S. Application Data
(60) Provisional application No. 60/081,366, filed on Apr. 10, 1998.

(51) Int. Cl.[7] ............... H01J 37/08; H01J 37/30; H01J 3/14; H01J 3/18; H01J 3/26; A61N 5/00; G21G 5/00
(52) U.S. Cl. ............... 250/492.21; 250/492.3; 250/492.1; 250/396 R
(58) Field of Search ................ 250/492.22, 492.21, 250/491.1, 232 R, 202, 492.1, 492.3, 396 R (56) References Cited

U.S. PATENT DOCUMENTS

| | | | |
|---|---|---|---|
| 4,503,329 A | * 3/1985 | Yamaguchi et al. | 250/309 |
| 4,574,179 A | * 3/1986 | Masuzawa et al. | 219/121 |
| 4,902,898 A | * 2/1990 | Jones et al. | 250/492.2 |
| 4,985,634 A | * 1/1991 | Stengl et al. | 250/492.2 |
| 5,198,677 A | * 3/1993 | Leung et al. | 250/424 |
| 5,532,495 A | * 7/1996 | Bloomquist | 250/492.1 |
| 5,650,631 A | * 7/1997 | Sohda et al. | 250/281 |
| 6,011,268 A | * 1/2000 | Nakasuji | 250/369 ML |
| 6,165,907 A | * 12/2000 | Yoneda et al. | 438/717 |

* cited by examiner

Primary Examiner—Bruce Anderson
Assistant Examiner—David A. Vanore
(74) Attorney, Agent, or Firm—Henry P. Sartorio (57) ABSTRACT

A plasma-formed ion-beam projection lithography (IPL) system eliminates the acceleration stage between the ion source and stencil mask of a conventional IPL system. Instead a much thicker mask is used as a beam forming or extraction electrode, positioned next to the plasma in the ion source. Thus the entire beam forming electrode or mask is illuminated uniformly with the source plasma. The extracted beam passes through an acceleration and reduction stage onto the resist coated wafer. Low energy ions, about 30 eV, pass through the mask, minimizing heating, scattering, and sputtering.

20 Claims, 9 Drawing Sheets

PLASMA FORMED ION BEAM PROJECTION LITHOGRAPHY SYSTEM

RELATED APPLICATIONS

This application claims priority of Provisional Application Ser. No. 60/081,366 filed Apr. 10, 1998.

GOVERNMENT RIGHTS

The United States Government has rights in this invention pursuant to Contract No. DE-AC03-76SF00098 between the United States Department of Energy and the University of California.

BACKGROUND OF THE INVENTION

The invention relates generally to ion beam lithography and more particularly to the masks in ion beam lithography systems.

As the dimensions of semiconductor devices are scaled down in order to achieve ever higher levels of integration, optical lithography will no longer be sufficient for the needs of the semiconductor industry, e.g. DRAM and microprocessor manufacture. Alternative "nanolithography" techniques will be required to realize minimum feature sizes of 0.1 µm or less. In addition, the next generation lithography technologies must deliver high production throughput with low cost per wafer. Therefore, efforts have been intensified worldwide in recent years to adapt established techniques such as X-ray lithography, extreme ultraviolet lithography (EUVL), electron-beam (e-beam) lithography, and ion projection lithography (IPL), to the manufacture of 0.1 µm-generation complementary metal-oxide-semiconductor (CMOS) technology. Significant challenges exist today for each of these techniques. In particular, there are issues with complicated mask technology.

Figure 1:
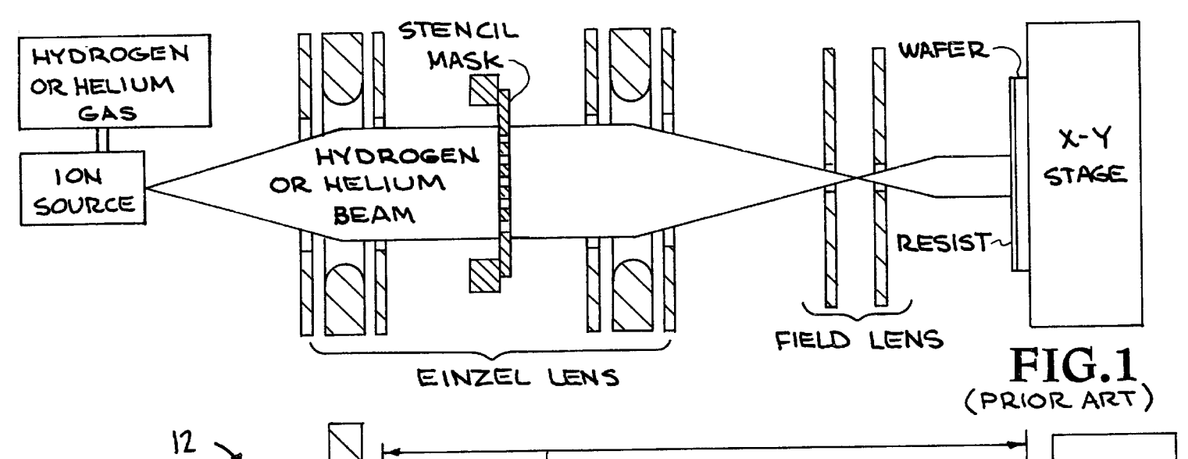
FIG. 1 illustrates a prior art IPL system system.

Conventional ion projection lithography (IPL) systems, as shown in FIG. 1, require many stencil masks for semiconductor circuit processing. An ion source with low energy spread is needed to reduce chromatic aberration. A small beam extracted from the source is accelerated to about 10 keV and expanded to form a parallel beam before impinging onto a large area stencil mask which contains many small apertures. The aperture pattern is then projected onto a resist layer on a wafer after the beam is reduced in size and made parallel by an Einzel lens system. Different masks with particular patterns must be used for each layer to be formed on the wafer. The stencil masks used in a conventional IPL system are a major source of problems, in terms of stability and lifetime.

Figure 2:
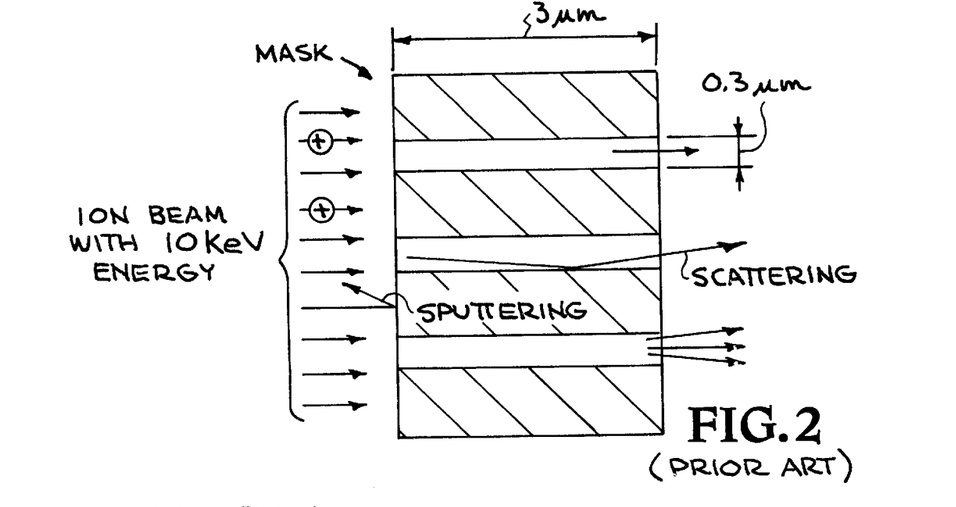
FIG. 2 illustrates a stencil mass of the prior art IPL system of FIG. 1.

In the conventional IPL setup, the stencil mask, shown in FIG. 2, is extremely thin, e.g. about 3 µm, to minimize beam scattering inside the aperture channels, which have a typical diameter of about 0.3 µm. Since the beam energy is high, about 10 keV, when it arrives at the mask, both sputtering and mask heating will occur, causing unwanted mask distortion and instability. There are also problems of beam uniformity and alignment since the stencil mask is at a distance from the ion source.

Acceleration and focussing columns are used in IPL systems as well as focussed ion beam (FIB) systems and electron beam (e-beam) systems to accelerate and reduce beam size. Typically, demagnification is accomplished by first accelerating a parallel beam for a distance and then focussing it to form a crossover beam. After that, the beam is allowed to expand again to the proper size before it is made parallel. The problem with beam crossover is that it can increase the longitudinal energy spread and produce image blur. This effect puts an upper limit on the maximum beam current and therefore lithography process throughput. One technique to reduce space charge force is to supply a large number of oppositely charged particles in the crossover region, but this is impractical to implement in an IPL system.

SUMMARY OF THE INVENTION

Accordingly it is an object of the invention to provide an ion projection lithography (IPL) system which has no stencil mask.

It is also an object of the invention to provide an IPL system in which the mask is not exposed to high energy ions.

The invention is a plasma-formed IPL system which eliminates the acceleration stage between the ion source and stencil mask. Instead the mask is used as a beam forming or extraction electrode, positioned next to the plasma in the ion source. Thus the entire beam forming electrode or mask is illuminated uniformly with the source plasma. The extracted beam passes through an acceleration and reduction stage onto the resist coated wafer. Because low energy ions, about 30 eV, pass through the mask, which is much thicker than a conventional stencil mask, heating, scattering, and sputtering are minimized so mask lifetime and performance are improved.

A multicusp ion source with magnetic filter produces ion beams with low energy spread, as low as 0.6 eV. The low energy plasma ions pass through the mask by applying a suitable (low) voltage, e.g. about 30 V, to the mask. A beam accelerator and reduction column after the mask produces a demagnified pattern on the resist. The accelerator and reduction column can be designed with beam crossover or without beam crossover.

DETAILED DESCRIPTION OF THE INVENTION

Figure 3:
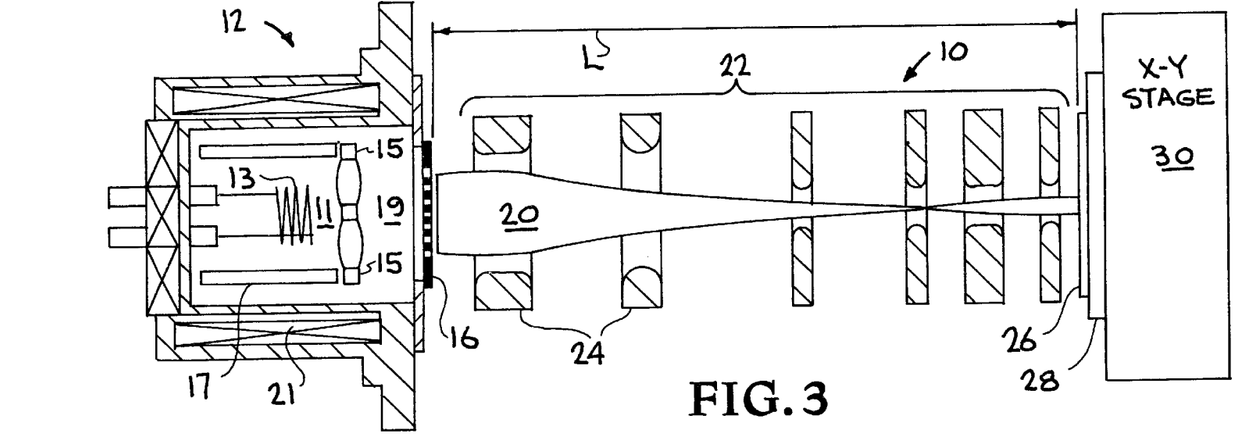
FIG. 3 shows a plasma formed IPL system according to the invention.

A plasma formed ion-beam projection lithography (PFIPL) system 10, shown in FIG. 3, has an ion source 12 with a relatively thick beam forming and extracting mask (electrode) 16 positioned at the output end thereof to form a multi-beamlet ion beam 20. The entire beam forming electrode or mask is illuminated uniformly with plasma from the ion source. The extracted beam 20 passes through an acceleration and reduction column 22, of length L, formed of a plurality of electrode lenses 24. Column 22 reduces the micro-beamlet pattern produced by mask 16 by factors greater than 5 to achieve feature sizes less than 100 nm. The beam from column 22 is incident on a resist layer 26 on a wafer 28 which is mounted on a mechanical stage or support 30 which may be translatable. The wafer 28 with exposed resist layer 26 is processed by conventional techniques.

The PFIPL system 10 is made up of the following major components:

A. Ion Source—Multicusp Plasma Generator

As shown in FIG. 3, ions are produced in a plasma generation region 11 of an ion source 12 which may be of conventional design. Plasma is generated by an RF antenna 13 or alternatively by a filament. A linear magnetic filter 15 or a coaxial magnetic filter 17 is used to decrease energy spread of the ions. The plasma ions pass to extraction region 19 of source 12. Conventional multicusp ion sources are illustrated by U.S. Pat. Nos. 4,793,961; 4,447,732; 5,198,677, which are herein incorporated by reference. Copending application Ser. No. 09/187,540 filed Nov. 6, 1998, which is herein incorporated by reference, describes a preferred ion source with a coaxial magnetic filter which has a very low energy spread.

The multicusp plasma generator provides positive ions needed for resist exposure. Normally either hydrogen or helium ions are used for this purpose. The external surface of ion source 12 is surrounded by columns of permanent magnets 21 which form multicusp fields for primary ionizing electron and plasma confinement. The cusp fields are localized near the source wall, leaving a large portion of the source free of magnetic fields. As a result, this type of ion source can generate large volumes of uniform and quiescent plasmas having relatively flat radial density profiles. For example, a 30 cm diameter chamber can be used to form a uniform plasma volume of about 18 cm diameter. Larger uniform plasmas can be generated by using bigger source chambers with well designed permanent magnet configurations.

The plasma of the multicusp source can be produced by either radio-frequency (RF) induction discharge or by dc filament discharge. However for PFIPL, an RF driven discharge is preferred since the quartz antenna coil typically used for antenna 13 will not generate impurities and there is no radiation heating of the first electrode of column 22 due to hot tungsten filament cathodes. The discharge plasma will be formed in short pulses, e.g. about 300 ms pulse length, with high or low repetition rates. With a magnetic filter in the source, the axial ion energy spread can be reduced to values below 1 eV. The output current density is high, e.g. greater than 250 mA/cm2, for pulsed operation and the source can produce ion beams of nearly any element.

B. Mask—Multibeamlet Extraction System

The open end of ion source 12 is enclosed by mask 16 which forms a multibeamlet extraction system. Mask 16 has a pattern of apertures or channels therethrough which define the mask pattern to be projected onto a workpiece. Mask 16 electrostatically controls (through a bias voltage) the passage of the beamlets to form the predetermined beamlet pattern to be projected. All the beamlets are controlled together, i.e. each different pattern requires a new mask. The mask is a beam forming electrode which is uniformly illuminated with plasma from the ion source.

Figure 4:
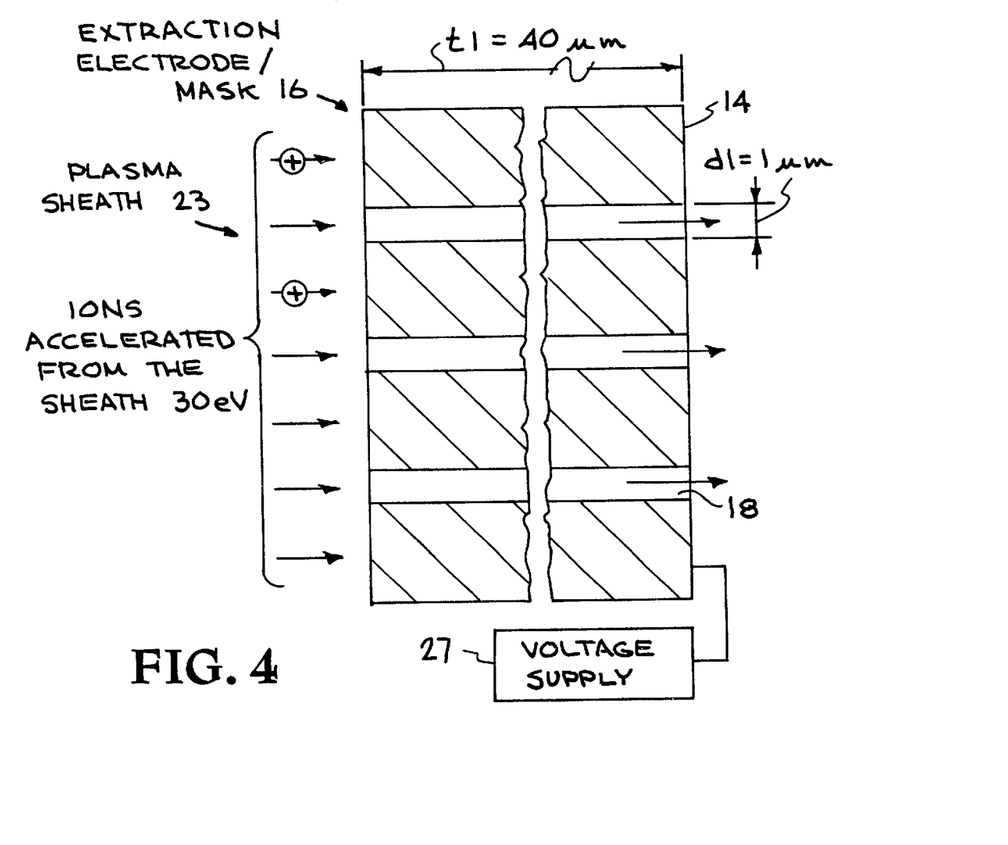
FIG. 4 illustrates a mask of the plasma formed IPL system of FIG. 3.

FIG. 4 illustrates a mask 16 which is formed of a conductive electrode 14 having a plurality of apertures or channels 18 formed therein. The apertures 18 in the electrode 14 will be arranged to fall within the uniform plasma density region of the source, i.e. in a plasma sheath 23 adjacent to the mask 16. Electrode 14 is connected to voltage source 27 to apply a small voltage, e.g. about 30 V negative with respect to the plasma, to cause positive ions from plasma sheath 23 to be accelerated from the sheath and pass through the apertures 18 in electrode 14. Thus the mask 16 functions as a beam forming and extraction electrode for the ion source. Electrode 14 has a thickness of t1, typically about 40 μm, and the diameter of the channels 18 through the mask 16 is d1, typically about 1 μm.

In operation, the electrode is biased negatively, about 30 V, with respect to the ion source chamber wall. A very thin plasma sheath is formed parallel to the electrode surface. Positive ions in the plasma will fall through the sheath and impinge perpendicular to the electrode with an energy of about 30 eV. Ions will enter the apertures of the mask, forming multiple beamlets. With such low impact energies, sputtering of the electrode will not occur. In addition, the heating power generated by ions on the electrode is extremely small and will not produce any instability of the extraction system. Because of low incoming energy, ion scattering inside the aperture channels is minimized. The ions will be absorbed on the channel surfaces rather than forming aberrated beams as they leave the apertures.

In this multibeamlet extraction system, circular apertures will typically be employed. There will be many apertures, e.g. each with a diameter of about 1 μm and a separation less than 100 nm. These circular patterns will be projected onto the resist on the wafer with a reduction factor of typically 20. The final image size of each beamlet will then be 50 nm with separation less than 5 nm. The material between the image dots will be made so small that they will disappear during the etching process.

Figure 5A:
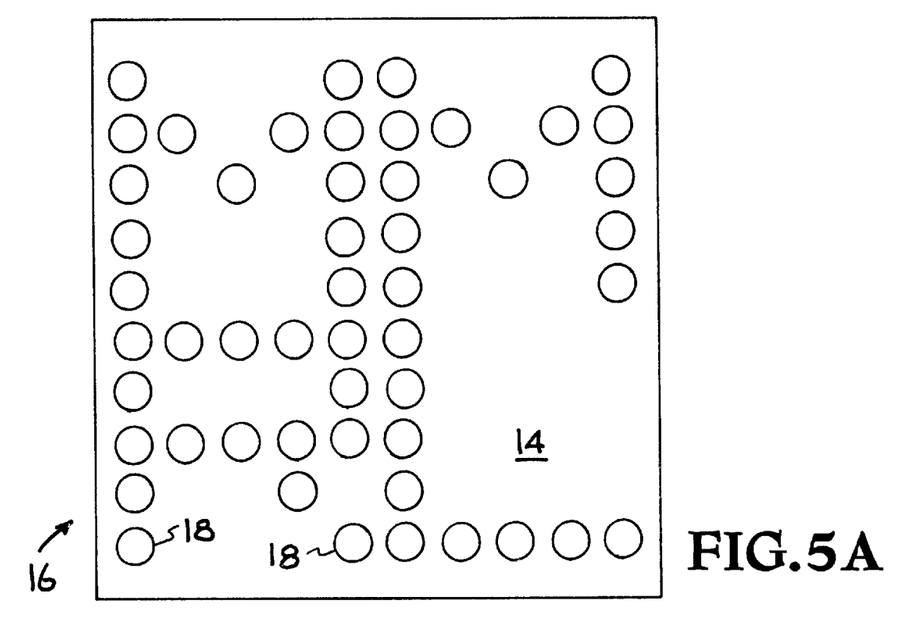
FIGS. 5A–C illustrate masks with aperture patterns in a matrix, and in single and double columns.
Figure 5B:
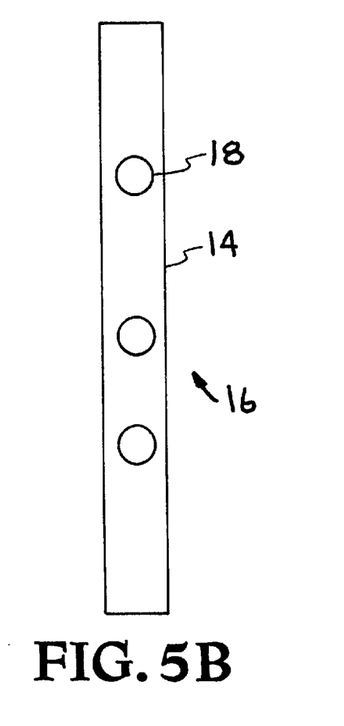
Figure 5C:
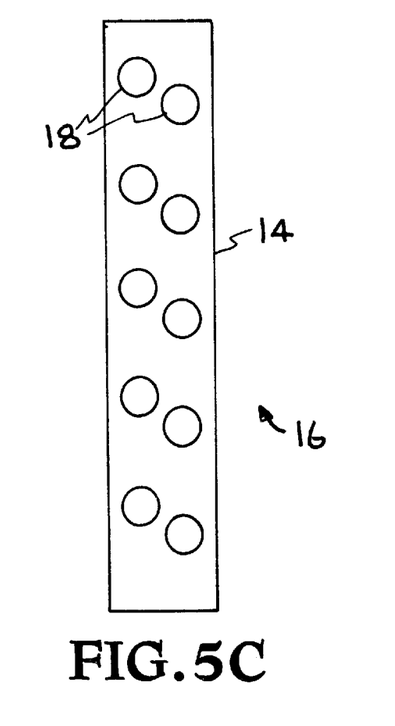

A large number of beamlets may be formed in a dot matrix arrangement as shown in FIG. 5A which illustrates a particular aperture pattern on a 10×10 size extraction mask. The mask produces a particular beamlet pattern dependent on the aperture pattern, i.e. a beamlet is extracted from each aperture. If the number of apertures is too large for fabrication, one can generate the desired pattern by combining beam reduction with dimensional scanning. Instead of a large N×N matrix, a single or double column of apertures as shown in FIGS. 5B, C can be used to produce some simple patterns. The beamlets in these columns can be scanned over the wafer in one direction by electrostatic deflection. Instead of scanning the entire beam, one can keep the beam stationary while moving the wafer substrate mechanically in very fine steps.

FIGS. 5A–C are all examples of the mask 16 formed of electrode 14 with apertures 18 as shown in FIG. 4.

Figure 10A:
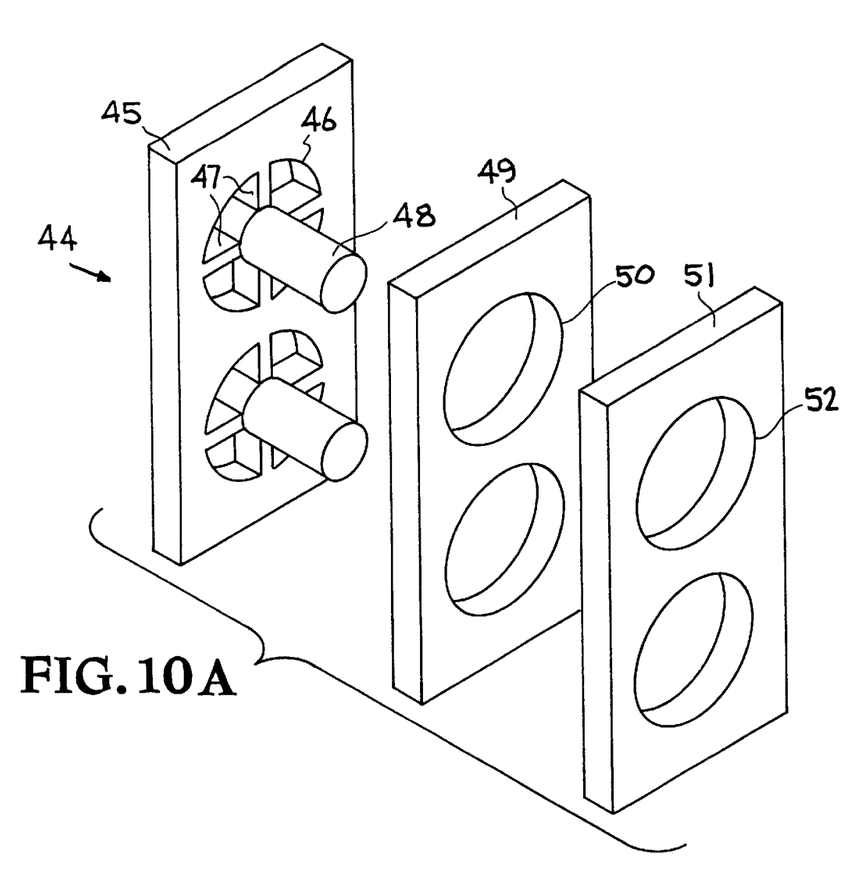
FIGS. 10A–D illustrate a mask design which produces a pattern of a dot inside an annulus or circle.
Figure 10B:
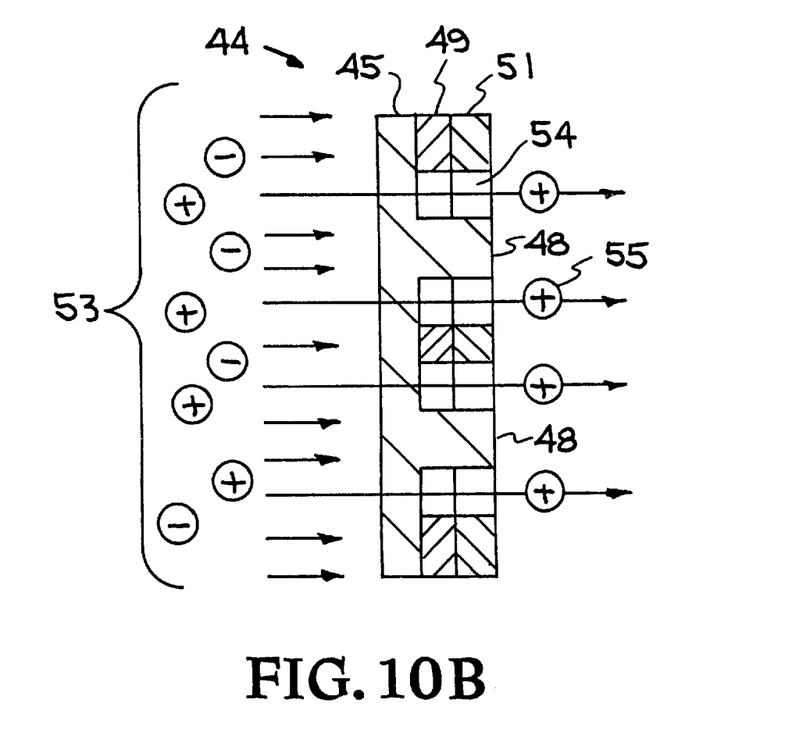
Figure 10C:
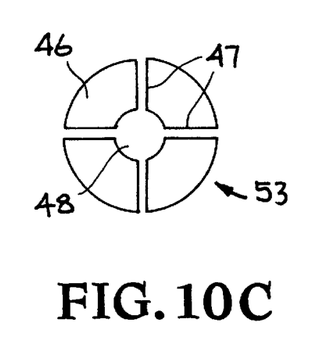
Figure 10D:
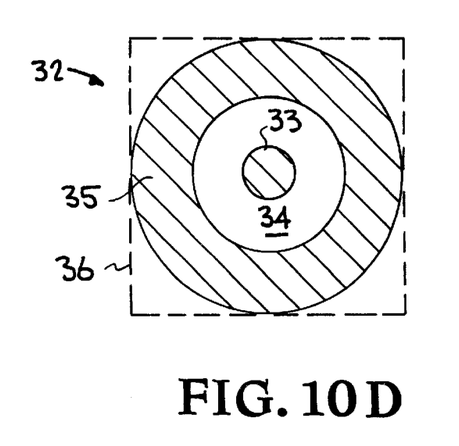

A particular mask or extraction electrode, shown in FIGS. 10A–C, for producing a dot inside a circle pattern, shown in FIG. 10D, may be used in the plasma formed ion beam system of the invention. The pattern 10 which has a central dot 33 inside an annular region or ring 34 is difficult to make in a prior art IPL system because to expose the annular region 34 while masking the central dot 33 cannot be done with a single mask since the portion of the mask to produce the central dot 33 must be freestanding. The pattern shown in FIG. 10D has a second annular region 35 surrounding annular region 34. This outer ring would not be made by the mask shown in FIGS. 10A–C but would require a second mask, leaving the dot 33 and ring 34 inside region 36 from the FIGS. 10A–C mask.

Mask 44, shown in assembly in FIG. 10A, has a base layer 45 made of silicon or other conductor. An aperture 46 is formed in base layer 45. A plurality, e.g. four, thin ribs 47 extend into aperture 46 and connect to and support a post 48 which extends out of the aperture 46. A second layer 49, made of an insulator, has an aperture 50 of the same size as aperture 46. Layer 49 is attached to layer 45 with apertures 46, 50 in alignment. A third layer 51, made of silicon or other conductor, has an aperture 52 of the same size as apertures 46, 50. Layer 51 is attached to layer 49 with aperture 52 aligned with apertures 46, 50. Post 48 has a height:extending from base 45 equal to the combined thicknesss of layers 49, 51. The assembled mask 44, shown in cross-section in FIG. 10B, defines an annular channel 54 between post 48 and apertures 50, 52 of layers 49, 51. Channel 54 communicates with aperture 46 in layer 45.

When mask 44 is positioned next to a plasma 53 in an ion source, and a low voltage is applied to layer 45, the plasma fills the aperture 46. If this layer alone were used as the extraction mask, the ribs 47 would cause problems. However, because the plasma is low energy, it drifts beyond aperture 46 into aperture 50 of layer 49. Post 48 blocks out the central portion but there are no ribs in aperture 50. Thus the plasma fills the circular ring between the aperture 50 and post 48. A low voltage applied to layer 51 draws ions 55 out of the plasma and into the following acceleration and reduction column. Again there are no ribs in aperture 52, but post 48 blocks the central portion. Thus the ions extracted from channel 54 of mask 44 will form the ring 34 of image 32.

C. Acceleration and Beam Reduction Column

Figure 6A:
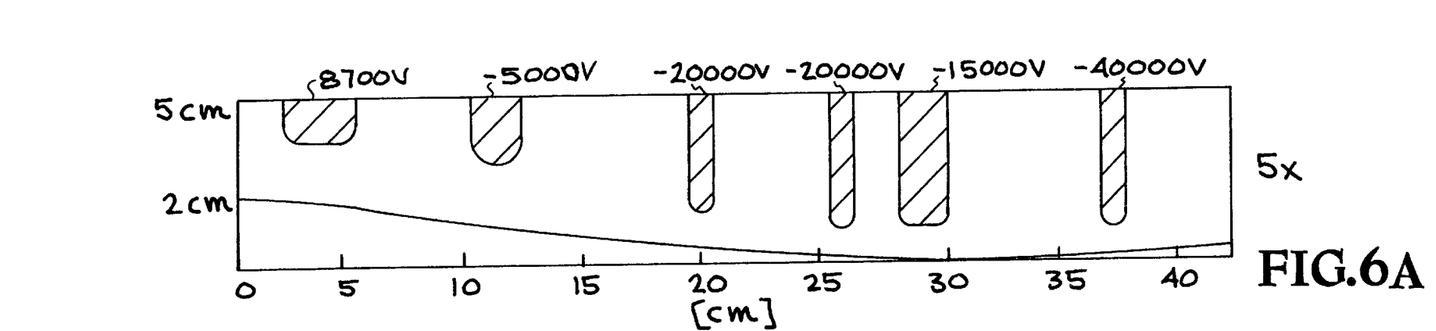
FIGS. 6A–F show acceleration and reduction columns with different demagnification factors.
Figure 6B:
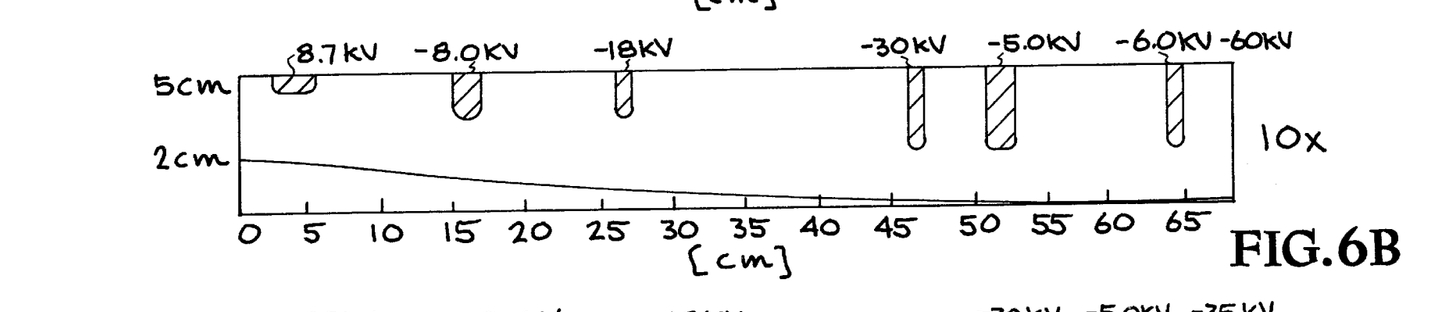
Figure 6C:
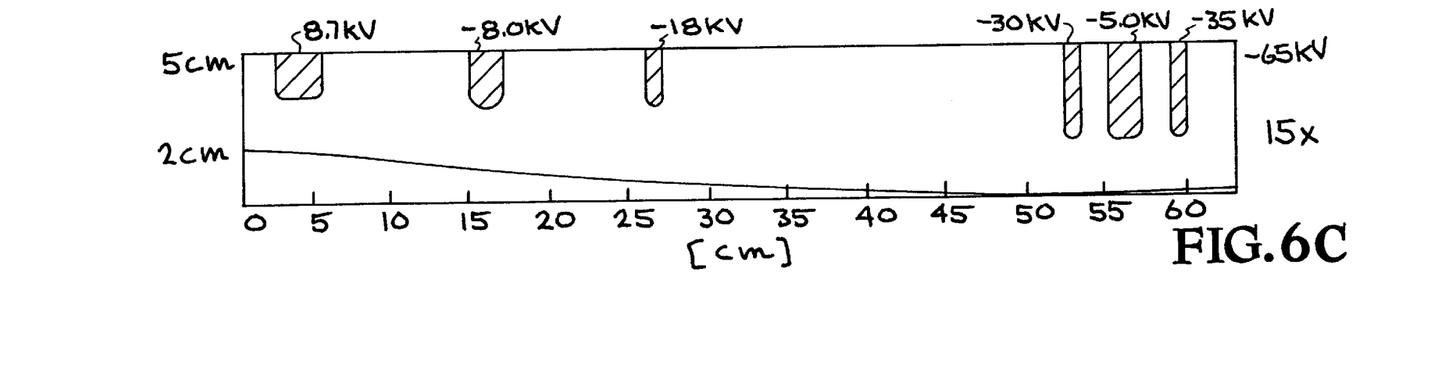
Figure 6D:
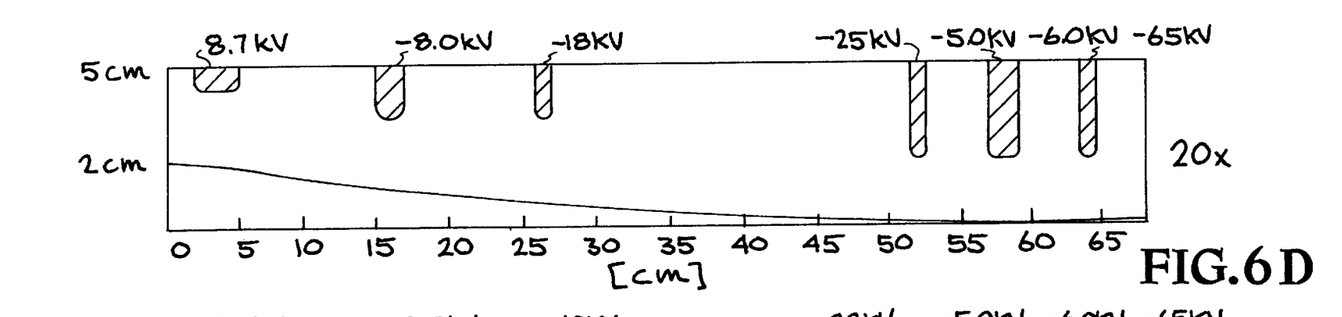
Figure 6E:
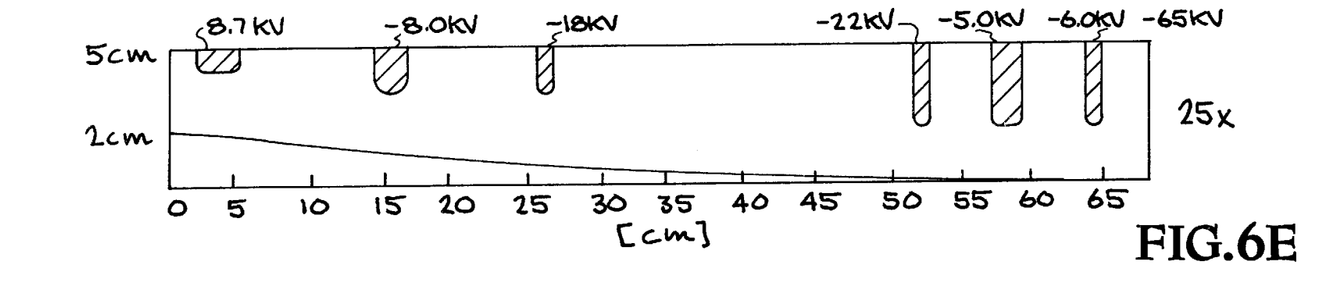
Figure 6F:
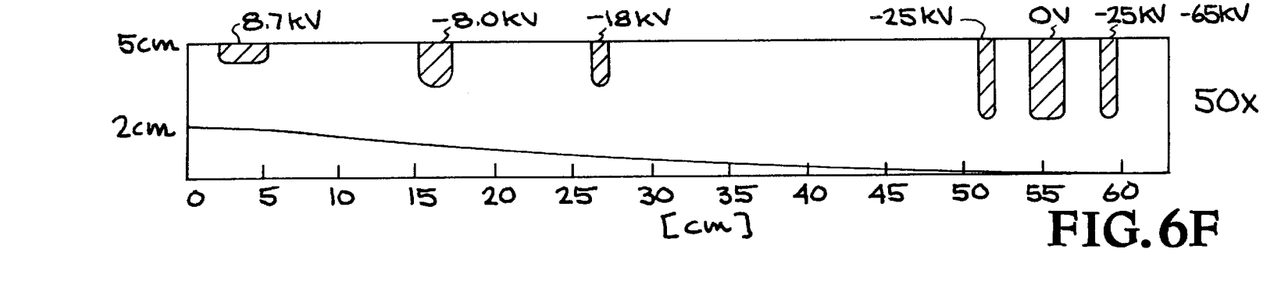

The micro-ion-beams leave the apertures of the extractor 16 with an energy of about 30 eV. They will be further accelerated and focussed by a simple all electrostatic acceleration and reduction column (lens system) 22 which is made up of a plurality of electrodes 24. The final parallel beam can be reduced to different sizes according to the particular lens design. FIGS. 6A–F illustrate lens systems with 5×, 10×, 15×, 20×, 25×, and 50× image reduction factors. For example, FIG. 6D shows a 20× image reduction system. The total length of this accelerator/reduction column is only about 65 cm, and other designs may be even shorter, e.g. about 35 cm.

Figure 7:
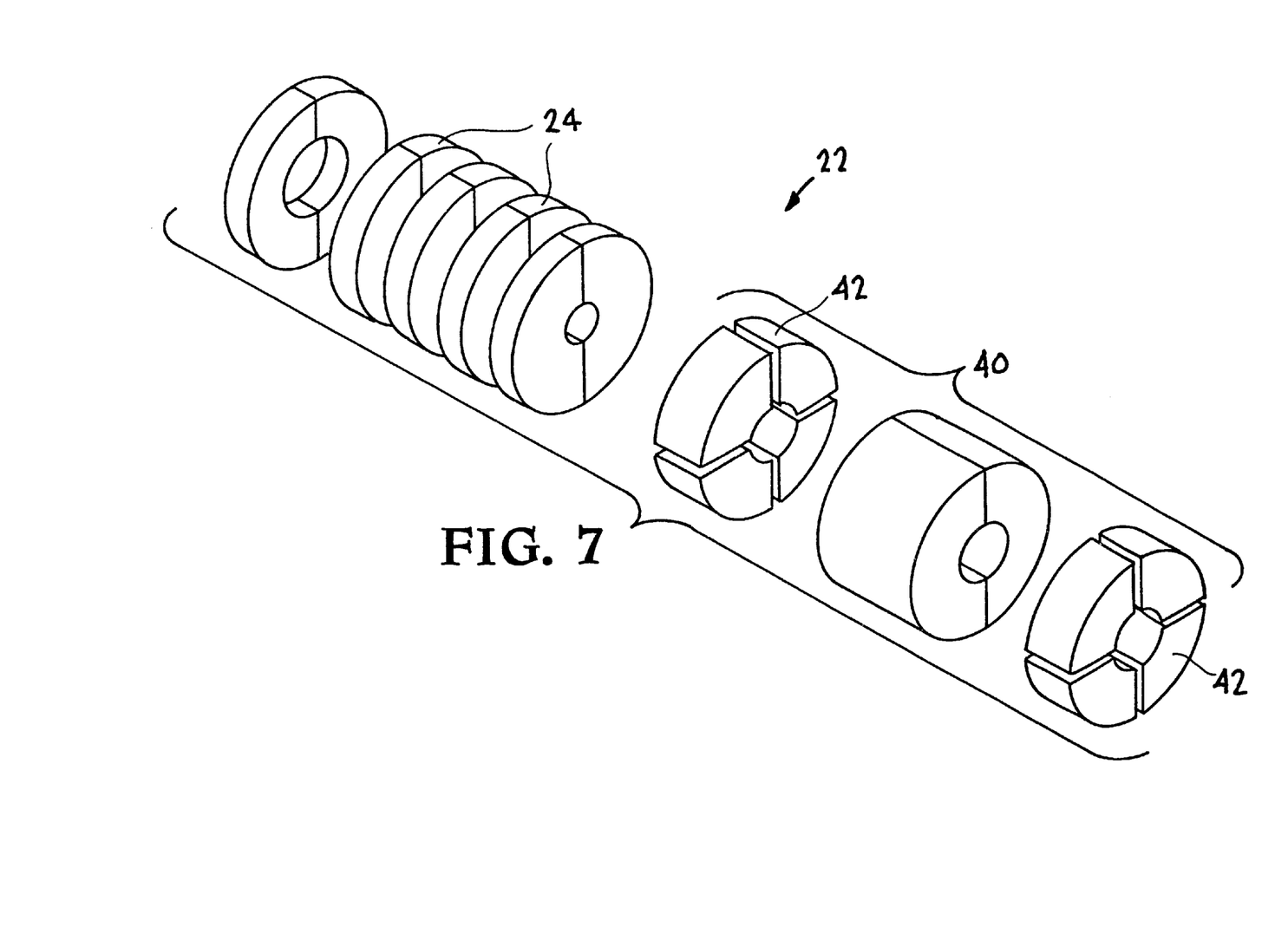
FIG. 7 shows the split electrodes of an Einzel lens of an acceleration and reduction lens column.

A portion of the acceleration and reduction column 22 may be made up of an Einzel lens system 40 which includes a pair of split electrodes 42, as shown in FIG. 7. The two Einzel electrodes 42 can be used to steer the beamlets by applying suitable voltages. This feature is important for circuit stitching purposes when the field of exposure is smaller than the chip size. By applying different voltages on the segments of the split electrodes 42, one can steer or scan the beam very fast, as fast as several cm in tens of nanoseconds, in the x or y direction.

Figure 8:
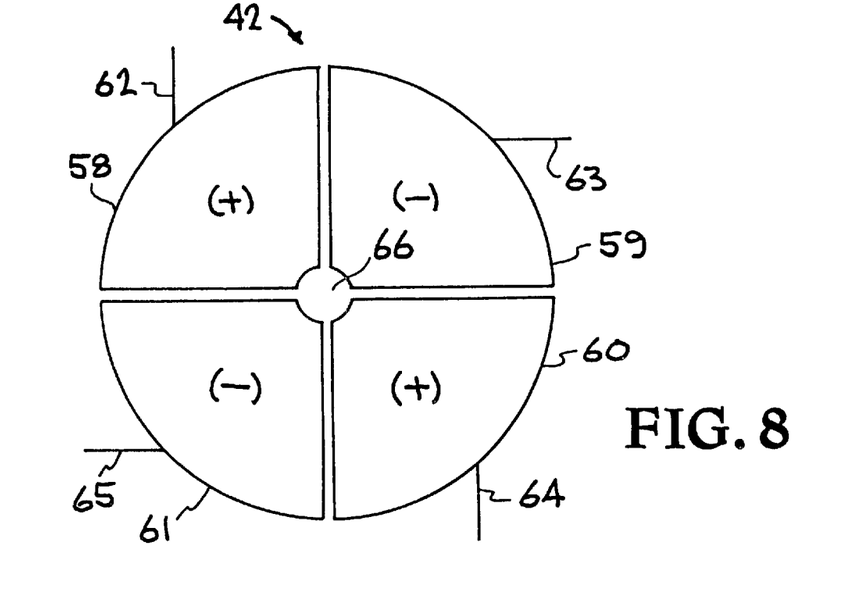
FIG. 8 shows the structure of a split electrode for an Einzel lens.

A split electrode 42, as shown in FIG. 8, which can be used in Einzel lens 40, is formed of four electrically isolated segments 58, 59, 60, 61. By applying voltages to the electrode segments through electrical connections 62, 63, 64, 65, a beam passing though central aperture 66 may be deflected or scanned, as well as focused.

Figure 9A:
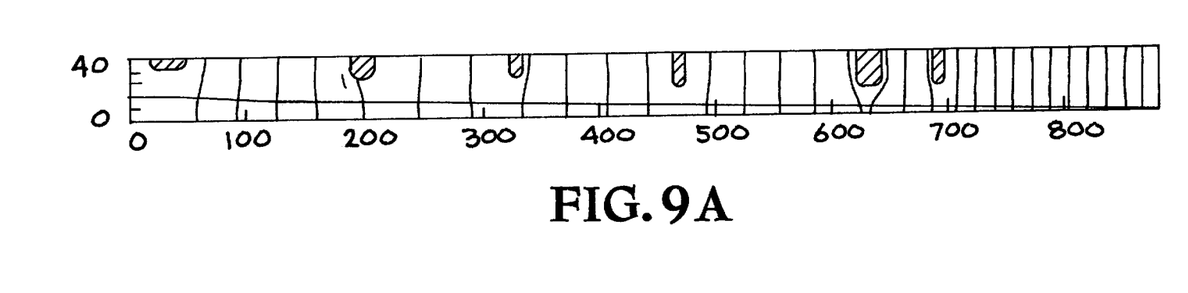
FIGS. 9A–C show non-crossover acceleration and reduction columns.
Figure 9B:
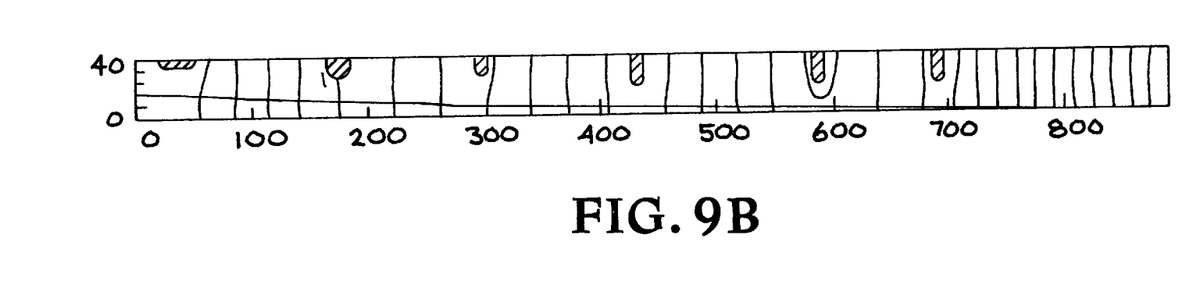
Figure 9C:
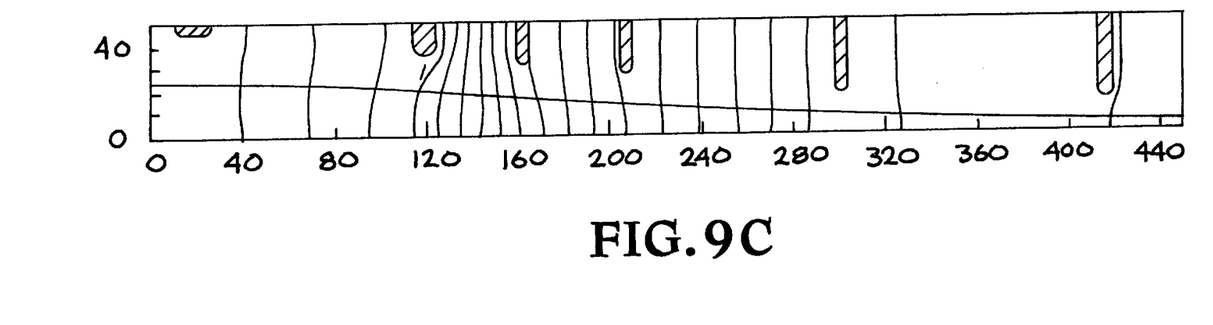

The beam reduction system can be designed with or without beam crossover. To eliminate crossover, the acceleration and focussing electrodes are chosen, i.e. spacing and applied voltage, so that the beam is smoothly reduced in diameter until the desired magnification is achieved, and then made parallel. FIGS. 9A–C illustrate non-crossover ion optics (lens) systems.

Similar acceleration/reduction columns are used in a maskless IPL (MMRL) system which uses a controllable pattern generator as a beam extraction system, as described in copending application Ser. No. 09/289,332 filed herewith, which is herein incorporated by reference. Very compact acceleration/reduction columns are also included in a focused ion beam (FIB) system described in copending application Ser. No. 09/225,996 filed Jan. 5, 1999, which is herein incorporated by reference. An ion beam produced by an ion source or plasma generator propagates through the FIB system to produce a focused output beam which has a spot size down to 1 $\mu$m or less and a current greater than 1 $\mu$A.

The plasma formed IPL system uses a patterned mask as a beam extracting electrode to produce a plurality of micro-ion beamlets in a defined pattern which are coupled to a beam reduction and acceleration column. Beam demagnification factors of up to 50 or more can be achieved with simple all-electrostatic accelerator columns. The system can provide economic and high throughput processing.

Thus the invention provides a method and apparatus for ion beam projection lithography which could be used in semiconductor manufacturing with minimum feature size of 100 nm or less. The invention eliminates problems of stability and lifetime with the stencil mask in a conventional IPL system. The mask is much thicker, about 40 $\mu$m, than a very thin conventional IPL stencil mask, typically about 3 $\mu$m, so the present mask is much easier to fabricate and is very stable. Since the ion beam current is less than 10 $\mu$A, the source can be operated with very low power. Since the plasma ions enter the mask apertures with low energy, mask heating, material sputtering, and ion scattering problems are minimized. Virtual source size, field curvature, geometric blur, and chromatic aberrations are not critical issues in this system. With 1000 nm apertures, a 20× reduction will produce 50 nm feature size on the wafer target.

Changes and modifications in the specifically described embodiments can be carried out without departing from the scope of the invention which is intended to be limited only by the scope of the appended claims.

What is claimed is:

1. A plasma formed ion-beam projection lithography system, comprising:
   a plasma generator which produces ions in a plasma generation region;
   a beamlet extraction mask having a plurality of apertures in a defined pattern, the mask being positioned adjacent to the plasma generation region of the ion source for electrostatically producing a controlled pattern of micro-ion-beamlets;
   an acceleration and reduction column following the mask and having aligned apertures therethrough for accelerating and focusing the micro-ion-beamlets extracted from the plasma generation region to produce a demagnified final ion beam.

2. The system of claim 1 wherein the plasma generator comprises a multicusp ion source.

3. The system of claim 2 wherein the plasma generator comprises a multicusp ion source with a coaxial magnetic filter.

4. The system of claim 1 further comprising a voltage source connected to the mask for applying a voltage to the mask to extract the beamlets.

5. The system of claim 1 wherein the acceleration and reduction system is configured to reduce the beam with beam crossover.

6. The system of claim 1 wherein the acceleration and reduction system is configured to reduce the beam without beam crossover.

7. The system of claim 1 wherein the acceleration and reduction column includes a split electrode Einzel lens for scanning the final ion beam over a workpiece.

8. The system of claim 1 wherein the acceleration and reduction column has a demagnification factor of about 5 to about 50.

9. The system of claim 1 wherein the acceleration and reduction column has a length of about 35 cm to about 65 cm.

10. The system of claim 1 further comprising a translatable stage positioned after the acceleration and reduction column for mounting a wafer to be processed.

11. A method of producing a focused ion beam comprising a plurality of beamlets in a predetermined pattern, comprising:

generating a plasma;

extracting ions from the plasma through a beamlet extracting mask which produces the predetermined pattern of beamlets;

passing the ions extracted through the mask through aligned apertures in an acceleration and reduction column.

12. The method of claim 11 further comprising directing the ion beamlets from the acceleration and reduction column onto a resist coated wafer.

13. The method of claim 11 further comprising configuring the acceleration and reduction column to reduce the beam without beam crossover.

14. The method of claim 11 wherein the acceleration and reduction column has a demagnification factor of about 5 to about 50.

15. An extraction mask for producing a pattern of an annulus around a central dot in an ion beam projection lithography system, comprising:

a first layer formed of a conductive material and having an aperture formed therein;

a plurality of ribs extending into the aperture in the first layer;

a post connected to and supported by the ribs and extending out of the aperture in the first layer;

a second layer formed of an insulator and having an aperture of the same size as the aperture in the first layer;

a third layer formed of a conductive material and having an aperture of the same size as the apertures in the first and second layers;

wherein the first, second and third layers are attached together in a sandwich configuration with their apertures aligned, with the post extending into the apertures of the second and third layers to define an annular channel.

16. The mask of claim 15 further comprising a controllable voltage source connected to the first and third layers.

17. The system of claim 1 wherein the mask has a thickness of about 40 $\mu$m.

18. The system of claim 17 wherein the apertures in the mask have diameters of about 1 $\mu$m.

19. The system of claim 1 wherein the extraction mask comprises an extraction mask for producing a pattern of an annulus around a central dot, comprising:

a first layer formed of a conductive material and having an aperture formed therein;

a plurality of ribs extending into the aperture in the first layer;

a post connected to and supported by the ribs and extending out of the aperture in the first layer;

a second layer formed of an insulator and having an aperture of the same size as the aperture in the first layer;

a third layer formed of a conductive material and having an aperture of the same size as the apertures in the first and second layers;

wherein the first, second and third layers are attached together in a sandwich configuration with their apertures aligned, with the post extending into the apertures of the second and third layers to define an annular channel.

20. The method of claim 11 wherein the step of extracting ions from the plasma through a beamlet extracting mask comprises extracting ions through an extraction mask for producing a pattern of an annulus around a central dot, the extraction mask comprising:

a first layer formed of a conductive material and having an aperture formed therein;

a plurality of ribs extending into the aperture in the first layer;

a post connected to and supported by the ribs and extending out of the aperture in the first layer;

a second layer formed of an insulator and having an aperture of the same size as the aperture in the first layer;

a third layer formed of a conductive material and having an aperture of the same size as the apertures in the first and second layers;

wherein the first, second and third layers are attached together in a sandwich configuration with their apertures aligned, with the post extending into the apertures of the second and third layers to define an annular channel.

* * * * *